United States Patent
DiBiase

(10) Patent No.: US 8,121,396 B1
(45) Date of Patent: Feb. 21, 2012

(54) ASSESSING CRITICAL DIMENSION AND OVERLAY TOLERANCE

(75) Inventor: Tony DiBiase, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 1163 days.

(21) Appl. No.: 11/872,451

(22) Filed: Oct. 15, 2007

Related U.S. Application Data

(60) Provisional application No. 60/970,356, filed on Sep. 6, 2007.

(51) Int. Cl.
*G06K 9/00* (2006.01)
*G21K 5/00* (2006.01)

(52) U.S. Cl. ............................. 382/149; 378/34; 378/35

(58) Field of Classification Search ............... 378/34–35
See application file for complete search history.

(56) References Cited

U.S. PATENT DOCUMENTS

| | | | |
|---|---|---|---|
| 6,977,183 B1 | 12/2005 | DiBiase | |
| 2003/0016340 A1* | 1/2003 | Butler | 355/72 |
| 2005/0095515 A1* | 5/2005 | Pellegrini | 430/30 |
| 2005/0105092 A1* | 5/2005 | Ausschnitt et al. | 356/401 |
| 2005/0231722 A1* | 10/2005 | Ausschnitt et al. | 356/401 |
| 2007/0002298 A1* | 1/2007 | Visser | 355/55 |

* cited by examiner

*Primary Examiner* — Brian Le
(74) *Attorney, Agent, or Firm* — Luedeka, Neely & Graham, P.C.

(57) ABSTRACT

A method for constructing an error map for a lithography process, by constructing a first error map using spatial error data compiled on a lithography tool used in the lithography process, and constructing a second error map using spatial error data compiled on a mask used in the lithograph process, and then combining the first error map and the second error map to produce an overall error map for the lithography process. In this manner, the spatial error is determined prior to committing product to the process, and excessive error can be corrected or otherwise resolved prior to such commitment. In various embodiments, the spatial error data includes lens error data and stage movement error data. In some embodiments the spatial error data compiled on the mask is constructed by comparing mask pattern placement data to mask pattern source files. Some embodiments include the step of adjusting process variables to reduce errors represented in the overall error map.

2 Claims, No Drawings

ASSESSING CRITICAL DIMENSION AND OVERLAY TOLERANCE

This application claims all priorities and other benefits of prior pending U.S. provisional application 60/970,356, filed 2007 Sep. 6.

FIELD

This invention relates to the field of integrated circuit fabrication. More particularly, this invention relates to photolithography of integrated circuits.

BACKGROUND

Modern integrated circuits are fabricated using a wide variety of processes, many of which involve photolithographic methods. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

As the feature size of integrated circuits has become smaller, new photolithographic methods have been instituted to enable these smaller feature sizes. One method is called dual pattern lithography. Dual pattern lithography uses multiple reticles (two or more) to expose a denser feature pattern (features closer together) than that which is possible using just a single reticle. This is accomplished by exposing a first set of features having a first spacing with a first reticle, and then interleaving a second set of features having a second spacing by exposure with a second reticle. By interleaving the feature sets in this manner, the spacing between the features of the two sets can be made closer than that which could otherwise be accomplished with features that are defined on a single reticle.

This process could be accomplished with more than two reticle sets as well, even though the name "dual pattern" tends to indicate a limitation of two reticles. Further, it is understood that the term "reticle" as used herein also includes "masks," and vice-versa. Further, separately exposed patterns that originate from a single reticle are also contemplated by dual pattern lithography.

The use of dual pattern lithography brings new problems that are not present with conventional lithography. For example, the use of dual pattern lithography tends to severely affect both critical dimension and overlay tolerances because of lens/scanner induced errors and reticle pattern placement errors. These errors have been compensated for in the past by directly measuring the exposed pattern after it is printed on the substrate, and then using the measured error information to make changes in the setup of the exposure tool.

Unfortunately, this method requires substrates to be printed before the errors can be measured. Because such a procedure is time consuming, this trial and error process carries with it a greater than desirable cost.

What is needed, therefore, is a system that overcomes problems such as those described above, at least in part.

SUMMARY

The above and other needs are met by a method for constructing an error map for a lithography process, by constructing a first error map using spatial error data compiled on a lithography tool used in the lithography process, and constructing a second error map using spatial error data compiled on a mask used in the lithograph process, and then combining the first error map and the second error map to produce an overall error map for the lithography process. In this manner, the spatial error is determined prior to committing product to the process, and excessive error can be corrected or otherwise resolved prior to such commitment. In various embodiments, the spatial error data includes lens error data and stage movement error data. In some embodiments the spatial error data compiled on the mask is constructed by comparing mask pattern placement data to mask pattern source files. Some embodiments include the step of adjusting process variables to reduce errors represented in the overall error map.

DETAILED DESCRIPTION

The embodiments of the present invention allow efficient and accurate assessment of the combined results of two reticle patterns in regard to critical dimension and overlay tolerances by considering (1) lens data, (2) reticle pattern placement data, and (3) computer aided design data. These three sets of information are described in more detail below.

The lens signature data (1) is available from routine service derived testing, or from the lens manufacturer. This data represents optical aberrations, and is also know as Zernike coefficients. This data is generally constant over time and other standard conditions, and tends to be unique to each lens or lens-illuminator combination. There is also an additional placement error (typically of from about three nanometers to about five nanometers) that is induced by the stage of the tool, and so forth. The lens data is used to match the available exposure tools. Vendors of such equipment can adjust the optical components in the lens to make each lens more like the other tools in the fleet that is owned by the fabricator.

The reticle pattern placement data (2) is available from the reticle fabrication files, such as are available through Vistec (IPRO tools). In the fabrication of reticles, such as electron beam generated reticles, there is an intrinsic limit on the precision at which the beam can write the patterns. This precision is currently no better than about twelve nanometers to about twenty nanometers at 4× magnification. When reduced to 1×, these errors manifest as edge placement error at the wafer plane of from about three nanometers to about five nanometers.

The computer aided design data (3) is the standard in regard to where the edges of patterns on the reticle should be. This information is taken from the computer files that were used to generate the reticle images such as GDSII or OASIS type data files.

Using the lens data, the reticle pattern placement data, and the computer aided design data for both of the reticles, an accurate prediction of the results of the dual lithography combination can be had before actually printing any integrated circuit substrates. This is accomplished by combining these data sets, such as into vector maps, to show the direction and magnitude of the placement error, or in the case of layer to layer overlay analysis, how well one level overlays to another.

The resulting images, containing actual lens and reticle errors, are then used to more accurately model and predict the resulting pattern from the two reticles. If there are anticipated, compounded problems that result in too great of an error in the printed image, then steps can be taken at this point to alleviate the condition, such as by using a different exposure tool or reworking the reticle. Thus, this method allows for many errors to be corrected prior to actually printing any integrated circuit substrates.

In one embodiment, the method is performed by clipping the GDS2 computer aided design data for strategic areas of the integrated circuit pattern on the reticle. Then the lens distortion data and/or the reticle pattern placement error is entered. The modeling pattern placement error is then computed, such as by using either sparse or aggressive sampling of either/both the lens field or reticle pattern placement error data. Finally, modeling software is used to determine the combined effects of the lens and reticle errors on the computer aided design data.

One example of a possible use of this method is to make routine checks by lithography group once reticles are manufactured and delivered to the fabrication facility. Lens and scanner tool data from the fabrication facility may then be combined with GDS2 data to create a clear picture of the final expected pattern, such as a vector map, prior to committing production substrates to the process.

Vector maps are typically used to show the direction and magnitude of the placement error, or in the case of layer to layer overlay, how well one level overlays to another. The compiled information is used to extract overlay correction values so that the misregistration can be improved. There is only so much that can be corrected and what is remaining is typically referred to as the "residual overlay error." However, the error coming from the reticles is responsible for most of what is currently called residual error.

The embodiments of the present invention enable the use of dual reticles. Currently, the critical dimension and overlay errors inherent in such a process are considered to be "uncorrectable" residual errors. The present method quantifies the error contributed from both the exposure tool (lens, illuminator, etc.) and from the reticles themselves. The method can be embodied in a software product, and can include a database catalogs the entire reticle stock and associated metrology of the fabrication facility.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A processor-based method for constructing an error map for a lithography process, the method comprising the steps of:
   using the processor, constructing a first error map using spatial error data, including lens signature data, compiled on a lithography tool used in the lithography process,
   using the processor, constructing a second error map using spatial error data, including pattern placement data, compiled on a mask used in the lithograph process, and
   combining the first error map and the second error map to produce an overall error vector map for the lithography process.

2. The method of claim 1, further comprising the step of adjusting process variables to reduce errors represented in the overall error map.

\* \* \* \* \*